US012512298B2

(12) United States Patent
Oh et al.

(10) Patent No.: US 12,512,298 B2
(45) Date of Patent: Dec. 30, 2025

(54) PLASMA PROCESSING DEVICE

(71) Applicant: SAMSUNG ELECTRONICS CO., LTD., Suwon-si (KR)

(72) Inventors: Sejin Oh, Hwaseong-si (KR); Youngdo Kim, Hwaseong-si (KR); Sanghun Kim, Hwaseong-si (KR); Sungyeol Kim, Yongin-si (KR); Sangki Nam, Seongnam-si (KR); Taemin Earmme, Hwaseong-si (KR); Changyun Lee, Hwaseong-si (KR); Seongmoon Ha, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 455 days.

(21) Appl. No.: 17/877,439

(22) Filed: Jul. 29, 2022

(65) Prior Publication Data

US 2023/0117953 A1 Apr. 20, 2023

(30) Foreign Application Priority Data

Oct. 20, 2021 (KR) ........................ 10-2021-0140491

(51) Int. Cl.
*H01J 37/32* (2006.01)

(52) U.S. Cl.
CPC ......... *H01J 37/3211* (2013.01); *H01J 37/321* (2013.01); *H01J 37/32174* (2013.01); *H01J 37/32357* (2013.01); *H01J 37/32183* (2013.01)

(58) Field of Classification Search
CPC ................. H01J 37/321; H01J 37/3211; H01J 37/32357; H01J 37/32577; H01J 37/32174; H01J 37/32183
See application file for complete search history.

(56) References Cited

U.S. PATENT DOCUMENTS

| | | | | |
|---|---|---|---|---|
| 5,792,272 | A | 8/1998 | van Os et al. | |
| 6,164,241 | A | 12/2000 | Chen et al. | |
| 6,297,595 | B1 | 10/2001 | Stimson | |
| 8,123,903 | B2 | 2/2012 | Lee et al. | |
| 8,741,097 | B2 | 6/2014 | Yamazawa et al. | |
| 8,951,385 | B2 * | 2/2015 | Maeda ............. | H01J 37/32155 438/758 |
| 9,624,898 | B2 | 4/2017 | Smith et al. | |
| 2003/0006019 | A1 * | 1/2003 | Johnson .................. | H05H 1/46 164/1 |

(Continued)

FOREIGN PATENT DOCUMENTS

| | | | |
|---|---|---|---|
| KR | 100737989 | B1 * | 7/2007 |
| KR | 10-1016573 | B1 | 2/2011 |

(Continued)

*Primary Examiner* — Kurt Sweely
(74) *Attorney, Agent, or Firm* — Sughrue Mion, PLLC

(57) ABSTRACT

A plasma generator may include a dielectric tube, an inner helical coil surrounding the dielectric tube and configured to generate plasma by forming a stationary wave of at least one of a magnetic field and an electromagnetic wave in the dielectric tube, a variable capacitor configuring a closed loop with the inner helical coil, an outer helical coil surrounding the inner helical coil and magnetically coupled to the inner helical coil, and a radio frequency (RF) power supply configured to provide RF power at a variable frequency to the inner helical coil.

18 Claims, 6 Drawing Sheets

(56) References Cited

U.S. PATENT DOCUMENTS

| | | | | |
|---|---|---|---|---|
| 2005/0093460 | A1* | 5/2005 | Kim | H01J 37/321<br>315/111.21 |
| 2012/0247679 | A1* | 10/2012 | Yamazawa | H01J 37/3244<br>156/345.48 |
| 2019/0189330 | A1* | 6/2019 | Fovell | H01J 37/321 |
| 2020/0219699 | A1* | 7/2020 | Yasui | H01J 37/321 |
| 2020/0365367 | A1* | 11/2020 | Yoshino | H01J 37/32577 |

FOREIGN PATENT DOCUMENTS

| | | | |
|---|---|---|---|
| KR | 10-2012-0112262 | A | 10/2012 |
| KR | 10-2079595 | B1 | 4/2020 |
| KR | 10-2190794 | B1 | 12/2020 |

* cited by examiner

PLASMA PROCESSING DEVICE

CROSS-REFERENCE TO RELATED APPLICATION

This application is based on and claims priority under 35 U.S.C. § 119 to Korean Patent Application No. 10-2021-0140491, filed on Oct. 20, 2021, in the Korean Intellectual Property Office, the disclosure of which is incorporated by reference herein in its entirety.

BACKGROUND

The disclosure relates to a plasma generator, a plasma processing device, and a method of manufacturing a semiconductor device by using the plasma processing device.

A degree of integration of semiconductor devices has rapidly increased due to the recent rapid development of semiconductor technology, and the size of wafers used for manufacturing semiconductor devices has also been increased to increase the efficiency of a process of manufacturing semiconductor devices.

To meet the trend of the semiconductor industry, it is essential to secure the uniformity of plasma used for thin-film deposition and etching operations. Accordingly, to obtain a plasma source for stably obtaining high-density and high-uniformity plasma in a low-temperature state, research into various plasma generating sources such as an inductively-coupled plasma (ICP) source, an electron cyclotron resonance (ECR) plasma source, a helicon plasma source, a helical resonator-type plasma source, or the like, has been actively conducted.

Among the various plasma generating sources described above, research indicates that the helical resonator-type plasma source is suitable as a source for discharging and maintaining high-density plasma at a low temperature. In particular, the straightness of ion particles according to structural characteristics of the helical resonator-type plasma source is very useful in semiconductor device processing. However, despite these advantages, the helical resonator-type plasma source has not been widely applied to the process of manufacturing semiconductor devices, such as diffusion, thin-film deposition, and etching operations, due to a high voltage induced by a helical coil and consequent damage to a dielectric tube by plasma sputtering.

SUMMARY

Example embodiments provide a plasma generator, a plasma processing device, and a method of manufacturing a semiconductor device by using the plasma processing device.

In accordance with an aspect of an example embodiment, a plasma generator includes a dielectric tube; an inner helical coil surrounding the dielectric tube, the inner helical coil being configured to generate plasma by forming a stationary wave of at least one of a magnetic field and an electromagnetic wave in the dielectric tube; a variable capacitor configuring a closed loop with the inner helical coil; an outer helical coil surrounding the inner helical coil, the outer helical coil being magnetically coupled to the inner helical coil; and a radio frequency (RF) power supply configured to provide RF power at a variable frequency to the inner helical coil.

In accordance with an aspect of an example embodiment, a plasma processing device includes a plasma generator; and a process chamber in which a wafer processed by the plasma generator is mounted, wherein the plasma generator includes a dielectric tube; an inner helical coil surrounding the dielectric tube, the inner helical coil being configured to generate plasma by forming a stationary wave of at least one of a magnetic field and an electromagnetic wave in the dielectric tube; a variable capacitor configuring a closed loop with the inner helical coil; an outer helical coil surrounding the inner helical coil, the outer helical coil being magnetically coupled to the inner helical coil; a conductive cylinder surrounding the dielectric tube, the inner helical coil, and the outer helical coil and configured to be applied with a ground potential; and a radio frequency (RF) power supply configured to provide RF power at a variable frequency to the inner helical coil, wherein a voltage of the inner helical coil is less than a voltage of the outer helical coil, and wherein a current of the inner helical coil is greater than a current of the outer helical coil.

In accordance with an aspect of an example embodiment, a method of manufacturing a semiconductor device includes forming plasma using a helical plasma generator; and processing a wafer using the plasma, wherein the helical plasma generator includes a dielectric tube; an inner helical coil surrounding the dielectric tube, the inner helical coil being configured to generate the plasma by forming a stationary wave of at least one of a magnetic field and an electromagnetic wave in the dielectric tube; a variable capacitor configuring a closed loop with the inner helical coil, wherein a capacitance of the variable capacitor is adjustable in a range of 10 pF to 1000 pF such that the variable capacitor resonates with the inner helical coil; an outer helical coil surrounding the inner helical coil, the outer helical coil being magnetically coupled to the inner helical coil; a conductive cylinder surrounding the dielectric tube, the inner helical coil, and the outer helical coil, the conductive cylinder being configured to be applied with a ground potential; and a radio frequency (RF) power supply configured to provide RF power at a variable frequency in a range from 25 MHz to 29 MHz to the inner helical coil, wherein a voltage of the inner helical coil is less than a voltage of the outer helical coil, and wherein a current of the inner helical coil is greater than a current of the outer helical coil.

In accordance with an aspect of an example embodiment, a plasma processing device includes a plasma generator; and a process chamber in which a wafer to be processed by the plasma generator is mounted, wherein the plasma generator includes a dielectric tube; an inner helical coil surrounding the dielectric tube, the inner helical coil being configured to generate plasma by forming a stationary wave of at least one of a magnetic field and an electromagnetic wave in the dielectric tube; an outer helical coil surrounding the inner helical coil and magnetically coupled to the inner helical coil; a conductive cylinder surrounding the dielectric tube, the inner helical coil, and the outer helical coil, the conductive cylinder being configured to be applied with a ground potential; and a radio frequency (RF) power supply configured to provide RF power at a variable frequency to the inner helical coil, wherein a voltage of the inner helical coil is less than a voltage of the outer helical coil, and wherein a current of the inner helical coil is greater than a current of the outer helical coil.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION

Figure 1:
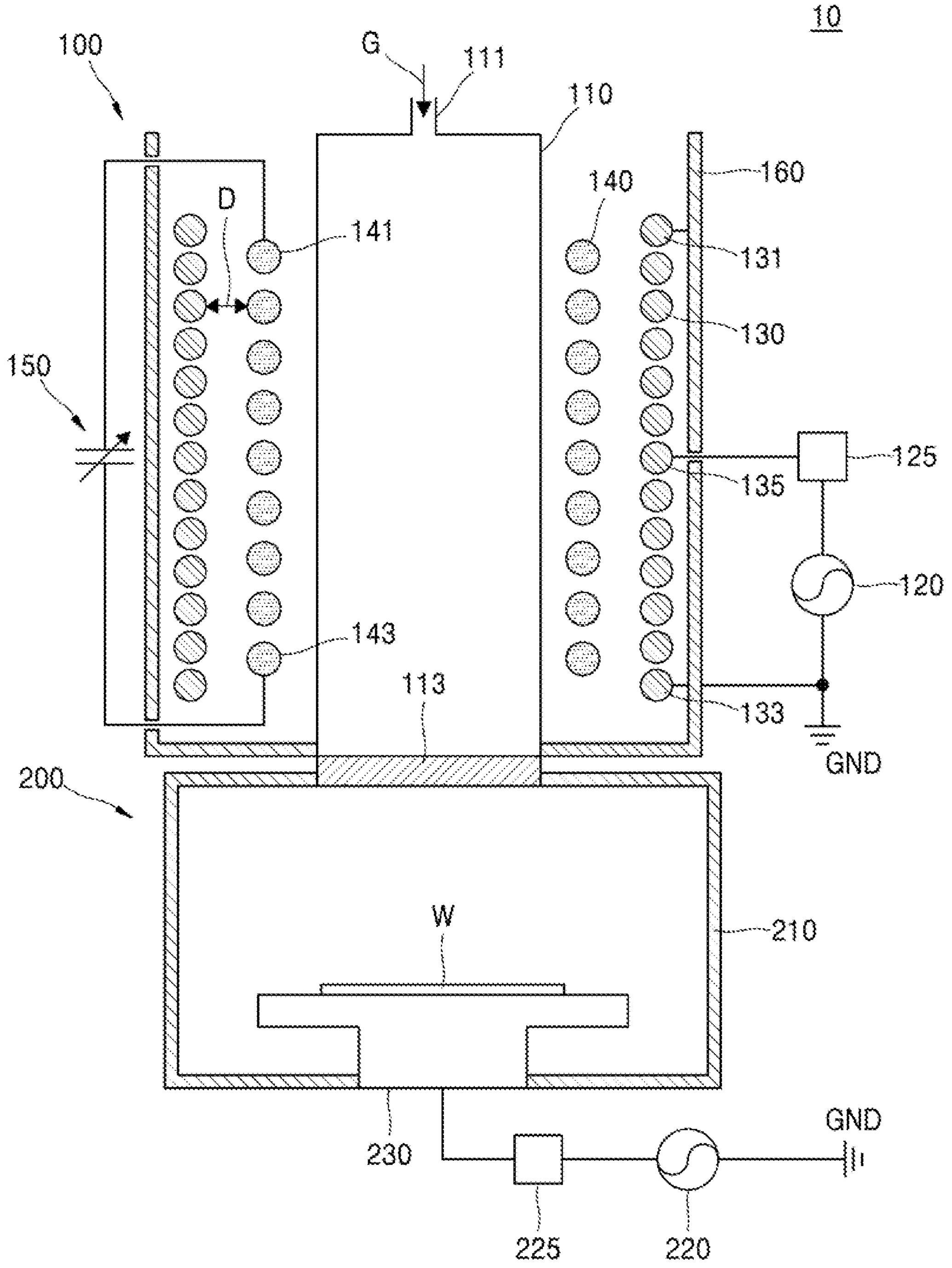
FIG. 1 is a schematic cross-sectional view of a plasma processing device according to example embodiments.

Hereinafter, example embodiments are described in detail with reference to the accompanying drawings. The same reference numerals are used for the same components in the drawings, and redundant descriptions thereof are omitted.

FIG. 1 is a schematic cross-sectional view of a plasma processing device 10 according to example embodiments.

Figure 2:
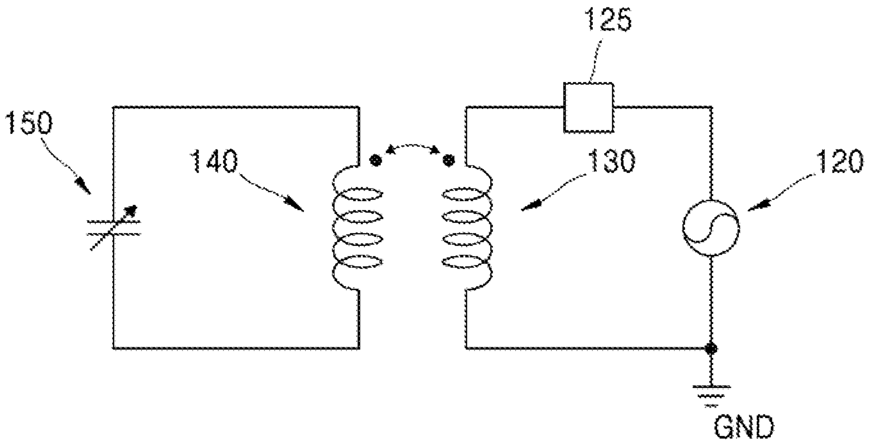
FIG. 2 is a circuit diagram illustrating connections of components of a plasma generator of FIG. 1.

FIG. 2 is a circuit diagram illustrating connections of components of a plasma generator 100 of FIG. 1.

Referring to FIGS. 1 and 2, the plasma processing device 10 may include the plasma generator 100 and a process chamber 200.

The plasma generator 100 may be configured to generate plasma based on a source gas G. The plasma generator 100 may be a helical resonator plasma source.

The plasma generator 100 may be coupled to the process chamber 200. Accordingly, plasma generated by the plasma generator 100 may be transferred to the process chamber 200 and may be used in processing a wafer W for manufacturing a semiconductor device in the process chamber 200.

According to example embodiments, the processing of the wafer W may include diffusion, plasma annealing, plasma etching, plasma-enhanced chemical vapor deposition, sputtering, plasma cleaning, or the like.

As an example, the processing of the wafer W may be a reactive ion etching operation. The reactive ion etching operation is a dry etching operation in which excited species (radicals, ions) by a high frequency of radio frequency (RF) power etch a substrate or a thin film in a low-pressure chamber. The reactive ion etching operation may be performed by bombardment of energetic ions and the complexity of physical and chemical actions of chemically active species. The reactive ion etching operation may include etching of an insulating layer such as silicon oxide, etching of a metal material, and etching of a doped or undoped semiconductor material.

As another example, the processing of the wafer W may be an isotropic etching operation. Plasma processing may include replacing a silicon oxide formed on the wafer W with ammonium hexafluorosilicate ($(NH_4)_2SiF_6$) and removing the ammonium hexafluorosilicate through annealing.

As another example, the processing of the wafer W may include an operation of alternately and repeatedly performing plasma processing and annealing processing on any one of crystalline and/or amorphous silicon, a silicon nitride, and a metal on the wafer W to isotropically remove any one of the crystalline and/or amorphous silicon, the silicon nitride, and the metal.

The wafer W may include, for example, silicon (Si). The wafer W may include germanium (Ge) or a compound semiconductor such as silicon carbide (SiC), gallium arsenide (GaAs), indium arsenide (InAs), and indium phosphide (InP). According to some embodiments, the wafer W may have a silicon-on-insulator (SOI) structure. The wafer W may include a buried oxide layer. According to some embodiments, the wafer W may include a conductive area, for example, wells doped with impurities. According to some embodiments, the wafer W may have various device isolation structures such as a shallow trench isolation (STI) structure for separating the doped wells from each other.

The plasma generator 100 may include a dielectric tube 110, an RF power supply 120, a matching network 125, an outer helical coil 130, an inner helical coil 140, a variable capacitor 150, and a conductive cylinder 160.

According to example embodiments, the dielectric tube 110 may include quartz. The dielectric tube 110 may have a substantially cylindrical shape. The dielectric tube 110 may include a gas inlet 111 for introducing the source gas G thereinto. The dielectric tube 110 may include a distribution plate 113 for supplying the generated plasma to the process chamber 200. The distribution plate 113 may include holes uniformly formed over an entire surface of the distribution plate 113, and accordingly, plasma having a uniform concentration may be transferred to the process chamber 200.

The RF power supply 120 may supply RF power. The supplied RF power may be configured to generate plasma. According to example embodiments, the RF power supply 120 may adjust a frequency of the RF power. According to example embodiments, the frequency of the RF power provided by the RF power supply 120 may be in a range from about 25 MHz to about 29 MHz. According to example embodiments, the frequency of the RF power provided by the RF power supply 120 may be about 27 MHz.

The outer helical coil 130 may be wound around the dielectric tube 110. The outer helical coil 130 may be wound in a plurality of turns to have a spiral shape along a circumference of the dielectric tube 110. A first terminal 131 and a second terminal 133 of the outer helical coil 130 may each be connected to the conductive cylinder 160. A ground potential GND may be applied to each of the first terminal 131 and the second terminal 133 of the outer helical coil 130 via the conductive cylinder 160.

The matching network 125 may be connected between the RF power supply 120 and the outer helical coil 130. The RF power generated by the RF power supply 120 may be supplied to the outer helical coil 130 via the matching network 125. The matching network 125 may improve the power transfer efficiency of the RF power supply 120 through impedance matching.

A terminal of the matching network 125 may be connected to a tapping point 135 of the outer helical coil 130. As a non-limiting example, the tapping point 135 may be a midpoint of the outer helical coil 130. When the tapping point 135 is the midpoint of the outer helical coil 130, an inductance between the tapping point 135 and the first terminal 131 may be substantially equal to an inductance between the tapping point 135 and the second terminal 133. Similarly, when the tapping point 135 is the midpoint of the outer helical coil 130, a winding number between the tapping point 135 and the first terminal 131 may be substantially equal to a winding number between the tapping point 135 and the second terminal 133.

When RF power is applied to the outer helical coil 130, a time-varying magnetic field may be generated by a current flowing in the outer helical coil 130. The RF power may be transferred from the outer helical coil 130 to the inner helical coil 140 by way of the time-varying magnetic field.

According to example embodiments, the outer helical coil 130 and the inner helical coil 140 may be coupled to each other by electromagnetic waves. According to example embodiments, RF power transferred to the outer helical coil 130 may then be transferred to the inner helical coil 140 as electromagnetic waves.

According to example embodiments, the outer helical coil 130 may surround the inner helical coil 140. According to example embodiments, the inner helical coil 140 may surround the dielectric tube 110. According to example embodiments, central axes of the outer helical coil 130 and the inner helical coil 140 may overlap each other. For example, the central axes of the outer helical coil 130 and the inner helical coil 140 may be collinear.

According to example embodiments, the outer helical coil 130 and the inner helical coil 140 may be spaced apart from each other. According to example embodiments, the outer helical coil 130 and the inner helical coil 140 may be electrically insulated from each other. According to example embodiments, a distance D between the outer helical coil 130 and the inner helical coil 140 may range from about 50 mm to about 2500 mm. According to example embodiments, the distance D between the outer helical coil 130 and the inner helical coil 140 may be substantially equal to a difference between a radius of the outer helical coil 130 and a radius of the inner helical coil 140.

According to example embodiments, the outer helical coil 130 may be magnetically coupled to the inner helical coil 140 and simultaneously coupled to an electromagnetic wave. According to example embodiments, a portion of the RF power transferred to the outer helical coil 130 may be magnetically transferred to the inner helical coil 140, and another portion of the RF power transferred to the outer helical coil 130 may be transferred to the inner helical coil 140 as electromagnetic waves.

According to example embodiments, the inner helical coil 140 may be electrically connected to the variable capacitor 150. According to example embodiments, the inner helical coil 140 may configure a closed loop with the variable capacitor 150. According to example embodiments, a first terminal 141 of the inner helical coil 140 may be connected to a first electrode of the variable capacitor 150, and a second terminal 143 of the inner helical coil 140 may be connected to a second electrode of the variable capacitor 150. According to example embodiments, the variable capacitor 150 may resonate with the inner helical coil 140.

According to example embodiments, the variable capacitor 150 may be configured to adjust a capacitance thereof. In other words, the capacitance of the variable capacitor 150 may be adjustable. As a non-limiting example, the variable capacitor 150 may be a vacuum-type capacitor. In this case, the capacitance of the variable capacitor 150 may be adjusted by adjusting a distance between two opposing electrode plates of the variable capacitor 150. According to example embodiments, the capacitance of the variable capacitor 150 may be adjusted in a range of about 10 pF to about 1000 pF.

According to example embodiments, the variable capacitor 150 may resonate with the inner helical coil 140 at a frequency of RF power supplied by the RF power supply 120. According to example embodiments, the capacitance of the variable capacitor 150 may be adjusted such that the variable capacitor 150 resonates with the inner helical coil 140 at a variable frequency of the RF power supplied by the RF power supply 120. Accordingly, the transfer efficiency of RF power from the outer helical coil 130 to the inner helical coil 140 may be improved.

According to example embodiments, the transfer efficiency of RF power from the outer helical coil 130 to the inner helical coil 140 may be 90% or more. According to example embodiments, the transfer efficiency of RF power from the outer helical coil 130 to the inner helical coil 140 may be 95% or more. According to example embodiments, the transfer efficiency of RF power from the outer helical coil 130 to the inner helical coil 140 may be 97% or more. According to example embodiments, the transfer efficiency of RF power from the outer helical coil 130 to the inner helical coil 140 may be 100% or less.

According to example embodiments, a winding number of the outer helical coil 130 may be greater than a winding number of the inner helical coil 140. Accordingly, when RF power is transferred from the outer helical coil 130 to the inner helical coil 140, a voltage of the RF power may decrease and a current may increase.

According to example embodiments, a voltage between the first and second terminals 141 and 143 of the inner helical coil 140 may be less than a voltage between the first and second terminals 131 and 133 of the outer helical coil 130. According to example embodiments, a voltage between the first and second terminals 141 and 143 of the inner helical coil 140 may be about 5% to about 40% of a voltage between the first and second terminals 131 and 133 of the outer helical coil 130. According to example embodiments, a voltage between the first and second terminals 141 and 143 of the inner helical coil 140 may be about 10% to about 30% of a voltage between the first and second terminals 131 and 133 of the outer helical coil 130. According to example embodiments, a voltage between the first and second terminals 141 and 143 of the inner helical coil 140 may be about 20% of a voltage between the first and second terminals 131 and 133 of the outer helical coil 130.

According to example embodiments, as a voltage in the inner helical coil 140 may be sufficiently low, the dielectric tube 110 may be prevented from being damaged by sputtering of plasma induced in the dielectric tube 110 onto an inner wall of the dielectric tube 110 by a potential difference induced by RF power.

The inner helical coil 140 may induce at least one of an electromagnetic wave and a magnetic field in a space inside the dielectric tube 110. The at least one of an electromagnetic wave and a magnetic field generated by the inner helical coil 140 may form a stationary wave in the dielectric tube 110. According to example embodiments, when the at least one of an electromagnetic wave and a magnetic field generated by the inner helical coil 140 forms a stationary wave, plasma may be generated due to resonance of electrons included in the source gas G.

An example embodiment in which the dielectric tube 110 is cylindrical, and the outer helical coil 130 and the inner helical coil 140 are wound around the dielectric tube 110 to have radial symmetry, is described. However, embodiments of the disclosure is not limited thereto, and a dielectric tube may have a polygonal prism shape such as a triangular prism and a quadrangular pole, an outer helical coil and an inner helical coil may have a corresponding symmetry, such as triangular symmetry and quadrangular symmetry, and may be wound around the dielectric tube, based on the above descriptions.

The process chamber 200 may include a chamber body 210, a power source 220, a matching network 225, and a chuck 230.

The chamber body 210 may separate a space inside the process chamber 200 from the outside. The chamber body 210 may include an inlet for supplying an additional process gas and an exhaust for discharging plasma and process gas. The exhaust may be connected to a vacuum pump such as a turbo molecular pump or the like. A shower head for making densities of the plasma and the process gas uniform may be further arranged in the chamber body 210.

The chuck 230 may support and fix the wafer W. The chuck 230 may be, for example, an electrostatic chuck for fixing the wafer W with an electrostatic force, but is not limited thereto. The chuck 230 may be, for example, a vacuum chuck that fixes the wafer W with vacuum pressure.

The power source 220 may supply power to the chuck 230. The matching network 225 may be connected between the power source 220 and the chuck 230. The matching network 225 may improve the transfer efficiency of power from the power source 220 to the chuck 230.

According to example embodiments, the power source 220 may supply, to the chuck 230, any one of clamping power for fixing the wafer W and bias power for accelerating plasma to the wafer W.

Figure 3:
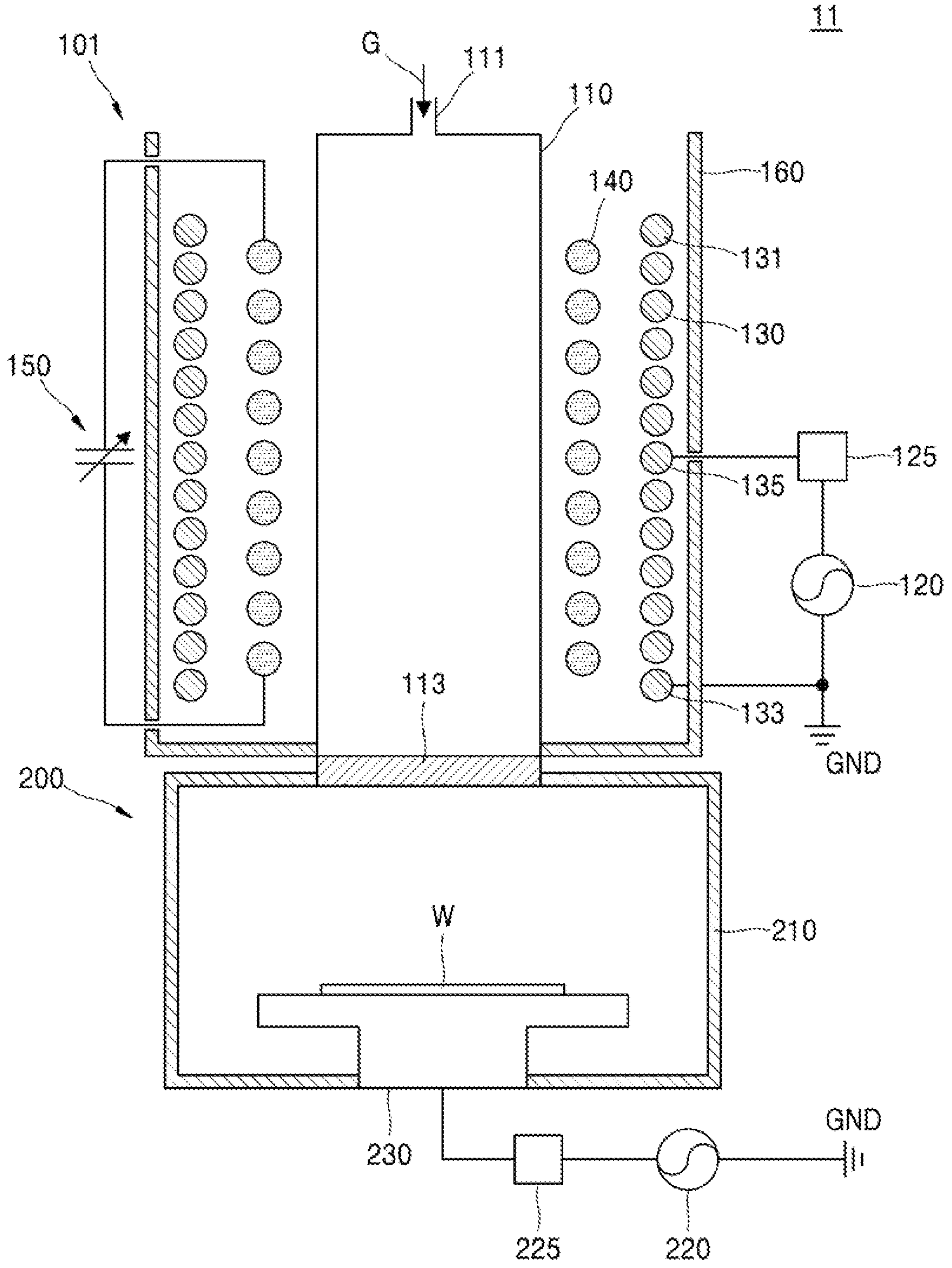
FIG. 3 is a schematic cross-sectional view of a plasma processing device according to example embodiments.

FIG. 3 is a schematic cross-sectional view of a plasma processing device 11 according to example embodiments.

Referring to FIG. 3, the plasma processing device 11 may include a plasma generator 101 and the process chamber 200.

The plasma generator 101 may include the dielectric tube 110, the RF power supply 120, the matching network 125, the outer helical coil 130, the inner helical coil 140, the variable capacitor 150, and the conductive cylinder 160.

The dielectric tube 110, the RF power supply 120, the matching network 125, the inner helical coil 140, the variable capacitor 150, the conductive cylinder 160, and the process chamber 200 are substantially the same as those described with reference to FIGS. 1 and 2, and thus, redundant descriptions thereof are omitted.

According to example embodiments, the first terminal 131 of the outer helical coil 130 may be opened, and the second terminal 133 thereof may be connected to the conductive cylinder 160. In this case, the first terminal 131 may be referred to as an open end, and the second terminal 133 may be referred to as a ground end. According to example embodiments, the first terminal 131 may be covered by a ceramic material to prevent spark discharge. According to example embodiments, a portion between the first terminal 131 and the tapping point 135 of the outer helical coil 130 may be interpreted as one electrode of a capacitor. That is, the conductive cylinder 160 and the portion between the first terminal 131 and the tapping point 135 of the outer helical coil 130 may be functionally equivalent to a capacitor. Accordingly, as an equivalent impedance of the outer helical coil 130 may be reduced, the transfer efficiency of RF power with respect to the outer helical coil 130 may be improved.

Figure 4:
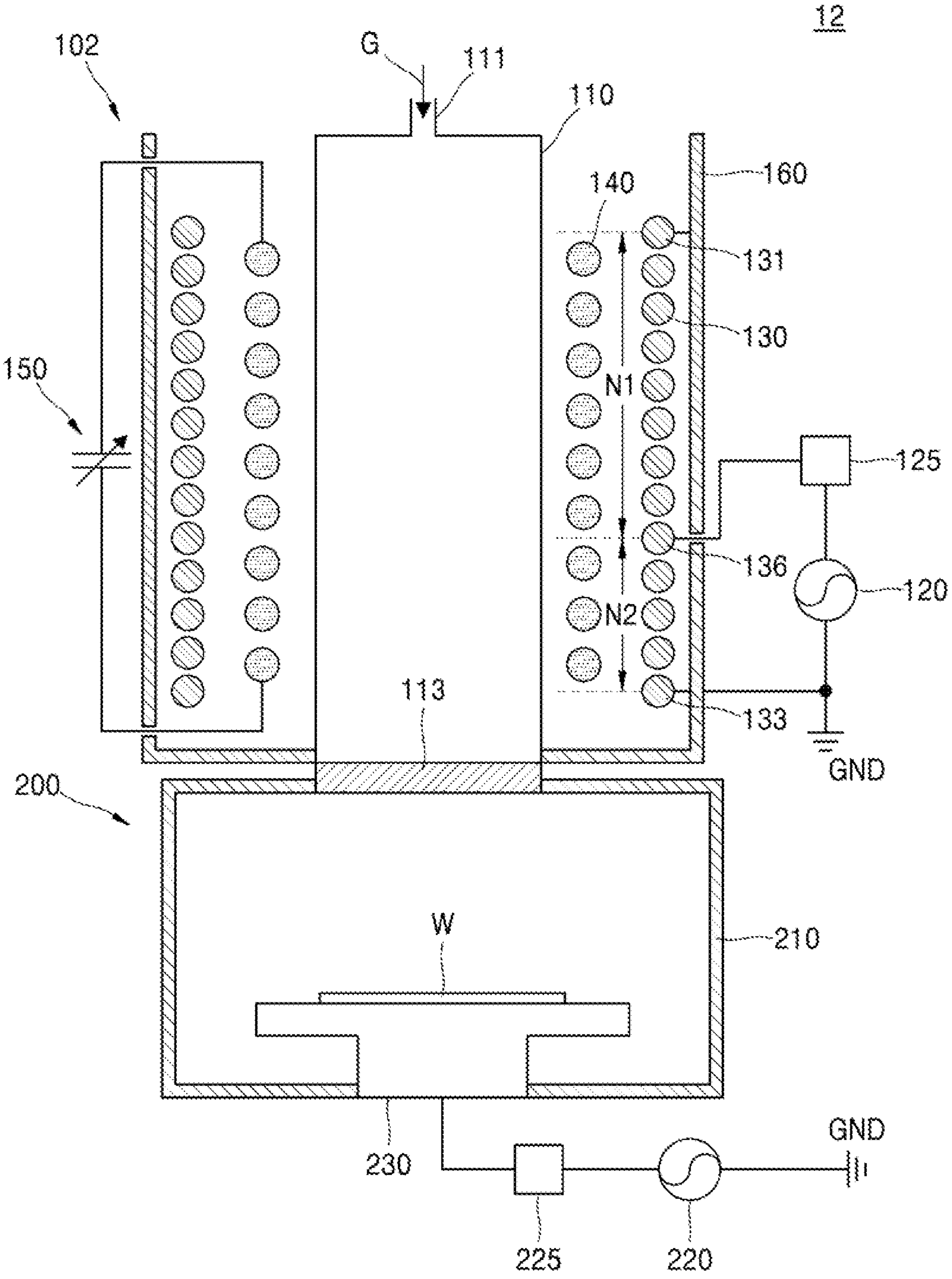
FIG. 4 is a schematic cross-sectional view of a plasma processing device according to example embodiments.

FIG. 4 is a schematic cross-sectional view of a plasma processing device 12 according to example embodiments.

Referring to FIG. 4, the plasma processing device 12 may include a plasma generator 102 and the process chamber 200.

The plasma generator 102 may include the dielectric tube 110, the RF power supply 120, the matching network 125, the outer helical coil 130, the inner helical coil 140, the variable capacitor 150, and the conductive cylinder 160.

The dielectric tube 110, the RF power supply 120, the matching network 125, the inner helical coil 140, the variable capacitor 150, the conductive cylinder 160, and the process chamber 200 are substantially the same as those described with reference to FIGS. 1 and 2, and thus, redundant descriptions thereof are omitted.

According to example embodiments, a tapping point 136 of the outer helical coil 130 may be in an asymmetric position. According to example embodiments, the tapping point 136 of the outer helical coil 130 may be apart from a center of the outer helical coil 130. In particular, a first winding number N1 between the tapping point 136 and the first terminal 131 may be different from a second winding number N2 between the tapping point 136 and the second terminal 133. Accordingly, an inductance between the tapping point 136 and the first terminal 131 of the outer helical coil 130 may be different from an inductance between the tapping point 136 and the second terminal 133 of the outer helical coil 130.

According to example embodiments, the first winding number N1 between the tapping point 136 and the first terminal 131 may be greater than the second winding number N2 between the tapping point 136 and the second terminal 133. Accordingly, the inductance between the tapping point 136 and the first terminal 131 of the outer helical coil 130 may be greater than the inductance between the tapping point 136 and the second terminal 133 of the outer helical coil 130.

Figure 5:
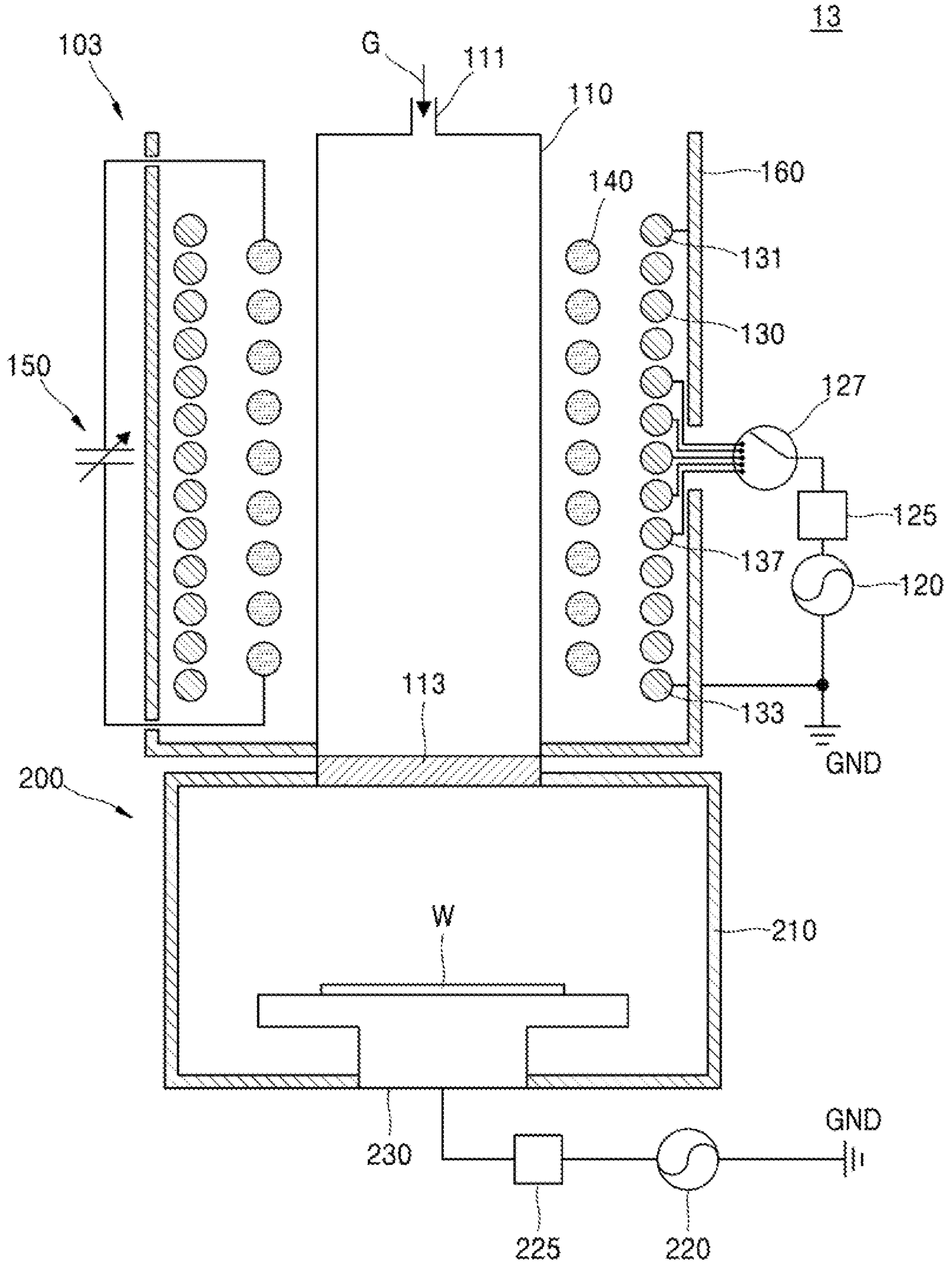
FIG. 5 is a schematic cross-sectional view of a plasma processing device according to example embodiments.

FIG. 5 is a schematic cross-sectional view of a plasma processing device 13 according to example embodiments.

Referring to FIG. 5, the plasma processing device 13 may include a plasma generator 103 and the process chamber 200.

The plasma generator 103 may include the dielectric tube 110, the RF power supply 120, the matching network 125, a switching device 127, the outer helical coil 130, the inner helical coil 140, the variable capacitor 150, and the conductive cylinder 160.

The dielectric tube 110, the RF power supply 120, the matching network 125, the outer helical coil 130, the inner helical coil 140, the variable capacitor 150, the conductive cylinder 160, and the process chamber 200 are substantially the same as those described with reference to FIGS. 1 and 2, and thus, redundant descriptions thereof are omitted.

According to example embodiments, the switching device 127 may be connected to the matching network 125 and the outer helical coil 130. According to example embodiments, the switching device 127 may be connected to a plurality of tapping points 137 on the outer helical coil 130. According to example embodiments, the switching device 127 may select one of the plurality of tapping points 137 to be connected to the matching network 125.

Figure 6:
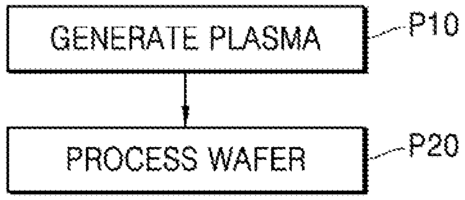
FIG. 6 is a flowchart illustrating a method of manufacturing a semiconductor device, according to example embodiments.

FIG. 6 is a flowchart illustrating a method of manufacturing a semiconductor device, according to example embodiments.

Referring to FIGS. 1 and 6, the method of manufacturing a semiconductor device may include operation P10 of generating plasma and operation P20 of processing the wafer W.

Operation P10 of generating plasma may be performed by any one or more of the plasma generators 100, 101, 102, 103, and 104 respectively included in the plasma processing devices 10, 11, 12, and 13 shown in FIGS. 1, 3, 4, and 5.

The generating of plasma may include applying RF power to the outer helical coil 130 to transfer the RF power to the inner helical coil 140, and forming a stationary wave of at least one of an electromagnetic wave and a magnetic field in the dielectric tube 110 using the inner helical coil 140.

Operation P20 of processing the wafer W may include diffusion, plasma annealing, plasma etching, plasma-enhanced chemical vapor deposition, sputtering, plasma cleaning, or the like, with reference to FIG. 1.

While example embodiments of the disclosure have been particularly shown and described with reference to embodiments thereof, it will be understood that various changes in form and details may be made therein without departing from the spirit and scope of the following claims.

What is claimed is:

1. A plasma processing device comprising:
a dielectric tube;
an inner helical coil surrounding the dielectric tube, the inner helical coil being configured to generate plasma by forming a stationary wave of at least one of a magnetic field and an electromagnetic wave in the dielectric tube;
a variable capacitor configuring a closed loop with the inner helical coil;
an outer helical coil surrounding the inner helical coil and magnetically coupled to the inner helical coil, the outer helical coil comprising a first terminal, a second terminal, and a plurality of tapping points between the first terminal and the second terminal;
a radio frequency (RF) power supply configured to provide RF power at a variable frequency to the outer helical coil;
a conductive cylinder surrounding the dielectric tube, the inner helical coil, and the outer helical coil, the conductive cylinder being configured to be applied with a ground potential;
a matching network connected between the RF power supply and the outer helical coil; and
a switching device connected to the matching network and the outer helical coil, the switching device selecting at least one tapping point of the plurality of tapping points and connecting the at least one tapping point to the matching network,
wherein the first terminal is coupled to the conductive cylinder and the second terminal is coupled to the conductive cylinder, and
wherein the ground potential is applied to each of the first terminal and the second terminal via the conductive cylinder.

2. The plasma processing device of claim 1, wherein a capacitance of the variable capacitor is adjustable in a range of about 10 pF to about 1000 pF.

3. The plasma processing device of claim 1, wherein a capacitance of the variable capacitor is adjustable such that the variable capacitor resonates with the inner helical coil.

4. The plasma processing device of claim 1, wherein the outer helical coil is electrically insulated from the inner helical coil.

5. The plasma processing device of claim 1, wherein the outer helical coil is spaced apart from the inner helical coil.

6. The plasma processing device of claim 1, wherein a distance between the outer helical coil and the inner helical coil is in a range of 50 mm to 2500 mm.

7. The plasma processing device of claim 1, wherein the outer helical coil is configured to magnetically transfer the RF power to the inner helical coil.

8. The plasma processing device of claim 7, wherein a transfer efficiency of the RF power from the outer helical coil to the inner helical coil is at least 90%.

9. The plasma processing device of claim 1, wherein a voltage of the inner helical coil is less than a voltage of the outer helical coil.

10. The plasma processing device of claim 1, wherein a current of the inner helical coil is greater than a current of the outer helical coil.

11. The plasma processing device of claim 1, wherein a winding number of the inner helical coil is greater than a winding number of the outer helical coil.

12. A plasma processing device comprising:
a plasma generator; and
a process chamber in which a wafer to be processed by the plasma generator is mounted,
wherein the plasma generator comprises:
a dielectric tube;
an inner helical coil surrounding the dielectric tube, the inner helical coil being configured to generate plasma by forming a stationary wave of at least one of a magnetic field and an electromagnetic wave in the dielectric tube;
a variable capacitor configuring a closed loop with the inner helical coil;
an outer helical coil surrounding the inner helical coil and magnetically coupled to the inner helical coil, the outer helical coil comprising a first terminal, a second terminal, and a plurality of tapping points between the first terminal and the second terminal;
a conductive cylinder surrounding the dielectric tube, the inner helical coil, and the outer helical coil, the conductive cylinder being configured to be applied with a ground potential;
a radio frequency (RF) power supply configured to provide RF power at a variable frequency to the outer helical coil;
a matching network connected between the RF power supply and the outer helical coil; and
a switching device connected to the matching network and the outer helical coil, the switching device selecting at least one tapping point of the plurality of tapping points and connecting the at least one tapping point to the matching network,
wherein the first terminal is coupled to the conductive cylinder and the second terminal is coupled to the conductive cylinder, and
wherein the ground potential is applied to each of the first terminal and the second terminal via the conductive cylinder.

13. The plasma processing device of claim 12,
wherein a first tapping point of the plurality of tapping points is between the first terminal of the outer helical coil and the second terminal of the outer helical coil that is opposite to the first terminal.

14. The plasma processing device of claim 13, wherein a first winding number between the first tapping point of the outer helical coil and the first terminal of the outer helical coil is equal to a second winding number between the first tapping point of the outer helical coil and the second terminal of the outer helical coil.

15. The plasma processing device of claim 13, wherein a first winding number between the first tapping point of the outer helical coil and the first terminal of the outer helical coil is less than a second winding number between the first tapping point of the outer helical coil and the second terminal of the outer helical coil.

16. The plasma processing device of claim 13, wherein a capacitance of the variable capacitor is adjustable in a range of 10 pF to 1000 pF such that the variable capacitor resonates with the inner helical coil.

17. A plasma processing device comprising:
a plasma generator; and
a process chamber in which a wafer to be processed by the plasma generator is mounted,
wherein the plasma generator comprises:
a dielectric tube;
an inner helical coil surrounding the dielectric tube, the inner helical coil being configured to generate plasma by forming a stationary wave of at least one of a magnetic field and an electromagnetic wave in the dielectric tube;

an outer helical coil surrounding the inner helical coil and magnetically coupled to the inner helical coil, the outer helical coil comprising a first terminal, a second terminal, and a plurality of tapping points between the first terminal and the second terminal;

a conductive cylinder surrounding the dielectric tube, the inner helical coil, and the outer helical coil, the conductive cylinder being configured to be applied with a ground potential;

a radio frequency (RF) power supply configured to provide RF power at a variable frequency to the outer helical coil;

a matching network connected between the RF power supply and the outer helical coil; and a switching device connected to the matching network and the outer helical coil, the switching device selecting at least one tapping point of the plurality of tapping points and connecting the at least one tapping point to the matching network, wherein the first terminal is coupled to the conductive cylinder and the second terminal is coupled to the conductive cylinder, and wherein the ground potential is applied to each of the first terminal and the second terminal via the conductive cylinder.

18. The plasma processing device of claim 17, further comprising:

a variable capacitor configuring a closed loop with the inner helical coil.

* * * * *